United States Patent
Chan et al.

(10) Patent No.: US 8,598,005 B2
(45) Date of Patent: Dec. 3, 2013

(54) METHOD AND MANUFACTURE FOR EMBEDDED FLASH TO ACHIEVE HIGH QUALITY SPACERS FOR CORE AND HIGH VOLTAGE DEVICES AND LOW TEMPERATURE SPACERS FOR HIGH PERFORMANCE LOGIC DEVICES

(75) Inventors: Simon Siu-Sing Chan, Saratoga, CA (US); Hidehiko Shiraiwa, San Jose, CA (US); Chuan Lin, Cupertino, CA (US); Lei Xue, Milpitas, CA (US); Kenichi Ohtsuka, Sunnyvale, CA (US); Angela Tai Hui, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/185,390

(22) Filed: Jul. 18, 2011

(65) Prior Publication Data
US 2013/0023101 A1    Jan. 24, 2013

(51) Int. Cl.
*H01L 29/772*    (2006.01)

(52) U.S. Cl.
USPC .......... 438/301; 438/257; 438/258; 438/275; 438/276; 438/279; 257/391; 257/392; 257/E21.626

(58) Field of Classification Search
USPC .......... 257/391, 392, E21.626; 438/257, 258, 438/275, 276, 279, 587, 369, 514
See application file for complete search history.

(56) References Cited

U.S. PATENT DOCUMENTS

| | | | | |
|---|---|---|---|---|
| 5,965,464 A * | 10/1999 | Tsai et al. | | 438/723 |
| 6,316,304 B1 * | 11/2001 | Pradeep et al. | | 438/230 |
| 6,403,487 B1 * | 6/2002 | Huang et al. | | 438/706 |
| 6,632,745 B1 * | 10/2003 | Yap et al. | | 438/696 |
| 6,670,227 B1 * | 12/2003 | Thio et al. | | 438/201 |
| 6,743,679 B2 * | 6/2004 | Lin et al. | | 438/275 |
| 6,808,985 B1 * | 10/2004 | Lee et al. | | 438/257 |
| 6,894,356 B2 * | 5/2005 | Choi | | 257/393 |
| 7,393,703 B2 * | 7/2008 | Anderson et al. | | 438/14 |
| 7,427,791 B2 * | 9/2008 | Matsuzaki et al. | | 257/295 |
| 7,445,989 B2 * | 11/2008 | Ema et al. | | 438/253 |
| 7,456,066 B2 * | 11/2008 | Wu | | 438/275 |
| 7,883,953 B2 * | 2/2011 | Zhang et al. | | 438/199 |
| 7,897,501 B2 * | 3/2011 | Cheng et al. | | 438/595 |
| 8,043,916 B2 * | 10/2011 | Park | | 438/275 |
| 8,044,451 B2 * | 10/2011 | Choi et al. | | 257/316 |
| 8,076,209 B2 * | 12/2011 | Yang et al. | | 438/299 |
| 8,080,842 B2 * | 12/2011 | Lee | | 257/314 |
| 8,169,017 B2 * | 5/2012 | Ema et al. | | 257/315 |
| 2003/0022445 A1 * | 1/2003 | Taniguchi et al. | | 438/257 |
| 2005/0130372 A1 * | 6/2005 | Lee | | 438/257 |
| 2006/0094229 A1 * | 5/2006 | Ema et al. | | 438/624 |
| 2007/0275531 A1 * | 11/2007 | Park | | 438/299 |
| 2008/0318387 A1 * | 12/2008 | Jain et al. | | 438/305 |
| 2009/0004804 A1 * | 1/2009 | Oh | | 438/290 |
| 2011/0031554 A1 * | 2/2011 | Fang et al. | | 257/369 |
| 2011/0258504 A1 * | 10/2011 | Cheng et al. | | 714/729 |

* cited by examiner

*Primary Examiner* — Julio J Maldonado
*Assistant Examiner* — Jaehwan Oh
(74) *Attorney, Agent, or Firm* — Sterne, Kessler, Goldstein & Fox P.L.L.C.

(57) ABSTRACT

A method and manufacture for memory device fabrication is provided. Spacer formation and junction formation is performed on both: a memory cell region in a core section of a memory device in fabrication, and a high-voltage device region in a periphery section of the memory device in fabrication. The spacer formation and junction formation on both the memory cell region and the high-voltage device region includes performing a rapid thermal anneal. After performing the spacer formation and junction formation on both the memory cell region and the high-voltage device region, spacer formation and junction formation is performed on a low-voltage device region in the periphery section.

20 Claims, 14 Drawing Sheets

METHOD AND MANUFACTURE FOR EMBEDDED FLASH TO ACHIEVE HIGH QUALITY SPACERS FOR CORE AND HIGH VOLTAGE DEVICES AND LOW TEMPERATURE SPACERS FOR HIGH PERFORMANCE LOGIC DEVICES

TECHNICAL FIELD

The invention is related to computer-readable memory, and in particular, but not exclusively, to a method and manufacture for creating spacers in flash memory in such a way that the spacers in the core section and the high-voltage device sections have high-quality spacers and low-temperature materials are employed for the spacers in the low-voltage, high performance logic devices.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer is formed over the top of the substrate and bit lines. The nitride serves as the charge storage layer between two insulating layers. Word lines are then formed over the top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different architectures of flash memory, including NOR flash and NAND flash.

BRIEF DESCRIPTION OF THE DRAWINGS

Non-limiting and non-exhaustive embodiments of the present invention are described with reference to the following drawings, in which.

DETAILED DESCRIPTION

Figure 1:
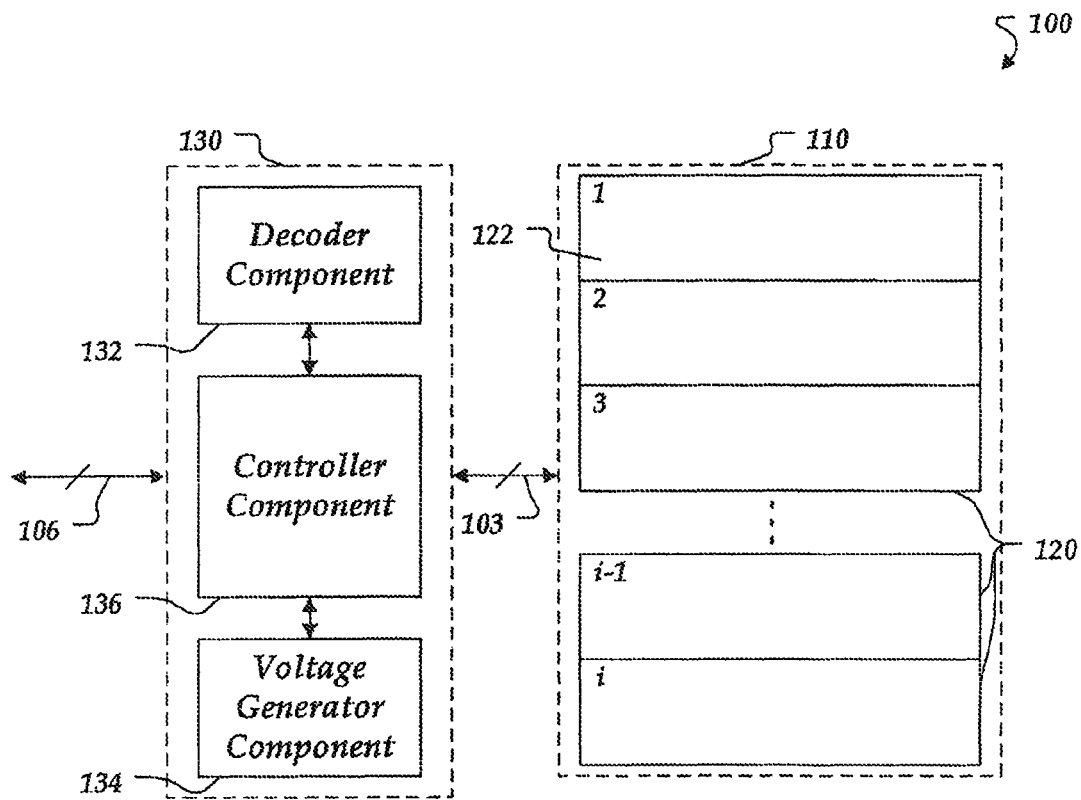
FIG. 1 illustrates a block diagram of an embodiment of a memory.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, a method and manufacture for memory device fabrication includes spacer formation and junction formation that is performed on both: a memory cell region in a core section of a memory device in fabrication, and a high-voltage device region in a periphery section of the memory device in fabrication. The spacer formation and junction formation on both the memory cell region and the high-voltage device region includes performing a rapid thermal anneal. After performing the spacer formation and junction formation on both the memory cell region and the high-voltage device region, spacer formation and junction formation is performed on a low-voltage device region in the periphery section.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although some embodiments of the invention described in the context of a MirrorBit™ NOR flash memory, the fabrication described herein may be employed in manufacturing other types of microelectronic memories or devices such as other various types of flash memory.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors 1-*i*) that can be accessed via memory controller 130. Memory sectors 120 can include, for example, 256, 512, 1024, 2048 or more sectors having memory cells that can be individually or collectively accessed. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In some embodiments, memory controller 130 may be located on the same chip as arrayed memory 110. In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, pre-programming, soft programming, and/or under-erase verifying operations. For example, voltage generator component 134 can include one or more cascode circuits, amplifier circuits, regulator circuits, and/or switch circuits that can be controlled by controller component 136

Controller component 136 is arranged to coordinate reading, writing, erasing, and other operations of memory 100. In one embodiment, controller component 136 is arranged to receive and transmit data from an upstream system controller (not shown). Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In some embodiments, memory 100 is a flash-based memory including flash-based memory cells, such as flash-based NOR cells, NAND cells, or hybrids of the two. In some embodiments, memory 100 is a MirrorBit™ flash memory.

Figure 2:
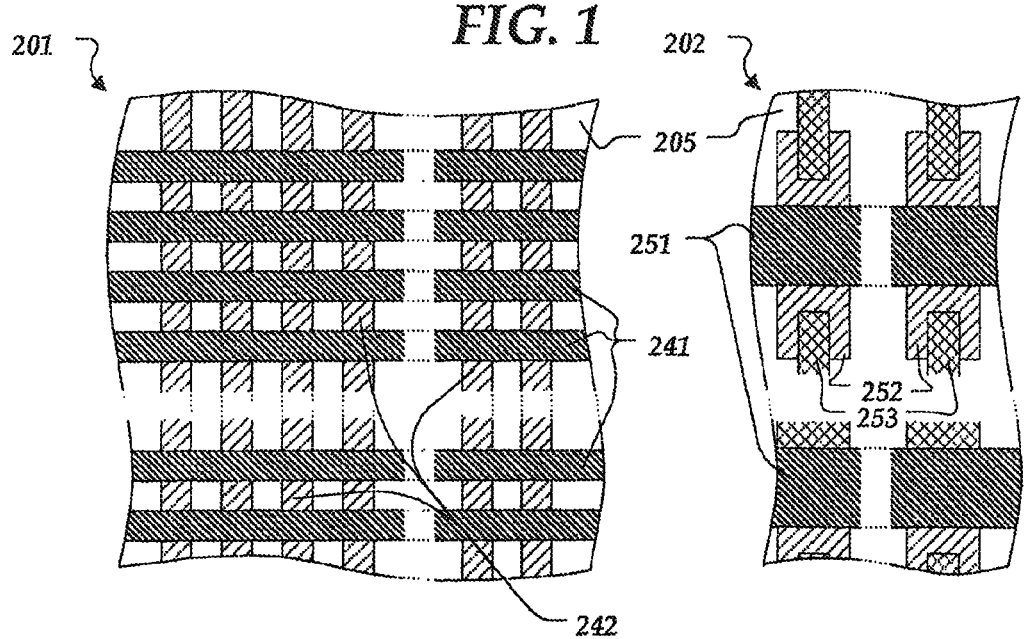
FIG. 2 shows a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line. Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed though individual conductive regions 242 collectively but not individually. In other embodiments, hybrid architectures can be employed. For example, core section 201 can be configured to have a portion that is NAND-based and another portion that is NOR-based. Also, although not shown if FIG. 2, core section 201 may include any of a variety of interconnect and/or passivation layers, such as dielectric, conductive, or other layers. For example, conductive regions 242 can be positioned beneath a dielectric spacer layer.

Peripheral section 202 includes peripheral polysilicon lines 251, conductive regions 252, and interconnects 253. Portions of peripheral polysilicon lines 251 are coupled to individual peripheral devices (not shown in FIG. 2).

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown FIG. 2, peripheral section 202 may also include any of a variety of other interconnect and/or passivation layers.

Figure 3:
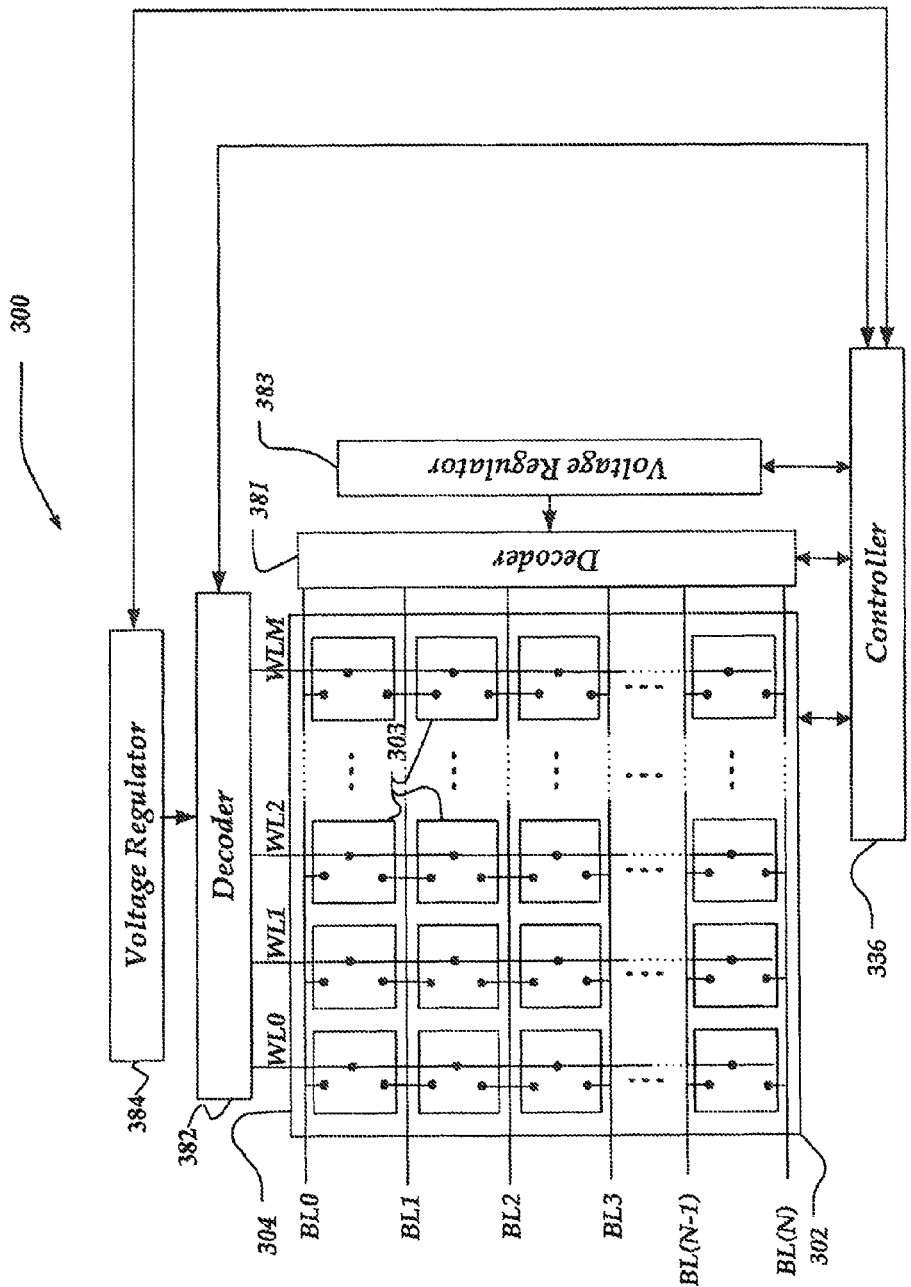
FIG. 3 illustrates a block diagram of an embodiment of a NOR memory array.

FIG. 3 illustrates a block diagram of an embodiment of memory device 300, which may be employed as an embodiment of memory device 100 of FIG. 1. Memory device 300 includes memory array 302 and individual memory cells 303 located within memory array 302. Memory cells 303 are arranged in N+1 rows and M+1 columns in memory array 302. In one embodiment, each row of memory array 302 is accessed by two of the bit lines BL0 to BLN. Each column of memory array 302 is accessed by one of word lines WL0 to WLM. Accordingly, each of memory cells 303 can be accessed by activating the corresponding bit lines and a corresponding word line of the cell. In one embodiment, each column of memory array 302 defines a data word. If N+1 has a value of 8, for example, the cells in each column of memory array 302 define a byte of data.

Memory cells 303 may be flash memory cells which store bits in different ways in different embodiments. In various embodiments, a single cell may store one or more bits. For example, some memory cells are single cell devices, some memory cells are dual cells devices, and in some embodiments, more than one distinct level of threshold voltage may be used to represent more than one bit per cells, as discussed in greater detail below. In some embodiments, flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("$V_T$") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the $V_T$ of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represent the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0" value). There also exist multi-level cell ("MLC") devices that can store more than one bit per cell by choosing between multiple levels of electrical charge to apply to the floating gates of its cells. In these devices, the amount of current flow is sensed (rather than simply its presence or absence), to determine more precisely the level of charge on the FG.

As one example, a dual cell device may also be a MLC device that stores four-bits-per-cell so that one transistor equates to 16 different states. This enables greater capacity, smaller die sizes and lower costs for the flash devices.

Memory device 300 further includes controller 336, decoder 381, decoder 382, voltage regulator 383, voltage regulator 384, and charge pump 386.

In some embodiments, voltage regulator 383 is arranged to receive a boosted bit word line voltage from a charge pump 385, and to provide an adjusted boosted bit line voltage based on control from controller 336. Similarly, in some embodiments, voltage regulator 384 is arranged to receive a boosted word line voltage from a charge pump, and to provide an adjusted boosted word line voltage based on control from controller 336. In other embodiments, voltage regulators 383 and 383 may be omitted from memory device 300, and the boosted voltages may be provided directly to the decoders.

Decoder 381 and decoder 382 can each receive address bus information from controller 336 and can utilize such information to facilitate accessing or selecting the desired memory cell(s) (e.g., memory location(s)) associated with the command, and to provide the needed voltages to the bit lines (decoder 381) and the word lines (decoder 382) according to timing that is controlled by controller 336.

Decoder 381 may also include a sector decoder in some embodiments. As such, decoder 309 may be arranged to facilitate accessing or selection particular column or grouping of columns within memory device 300. For example, a grouping of columns may define a sector, and another grouping of columns may define another sector. In another embodiment, portion 301 may include an array decoder for to a particular memory array 304. In addition, embodiments of array decoders can be configured to work separately or in conjunction with a sector decoder.

In some embodiments, decoders such as decoder 381 and decoder 382 may each receive a boosted voltage, which may be received at the gates of one of more transistors in the decoders. These transistors may be referred to as high-voltage (HV) transistors or HV devices due to the boosted voltage that the HV transistors receive at their respective gates. HV transistors may be used in bit line decoding, word line decoding, sector decoding, array decoding, and/or the like. In contrast, logic in the periphery section of the flash memory includes transistors that have gates that receive voltages that are not boosted. These transistors may be referred to as low-voltage (LV) transistors or LV devices. For example, controller 336 may include high-performance logic that includes LV transistors. The HV devices, LV devices, and core memory cells have different requirements, including different poly heights.

Memory controller 336 is also configured to control the activation and de-activation of individual word lines WL0 to WLM for reading, writing, and/or erasing to memory array 302. For example, memory controller 310 can provide a select signal to decoder 382 to select one of the columns WL1 to WLM to activate that column. Further, memory controller 336 can provide a select signal to decoder 381 for selecting particular rows BL0 to BLN (or sector) to be written to or read from.

Figure 4:
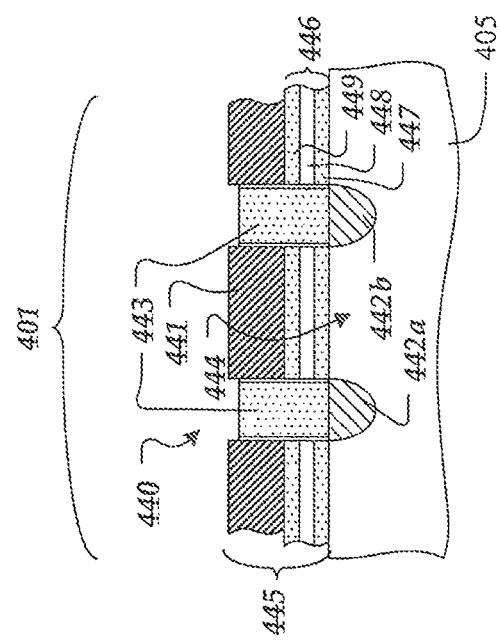
FIG. 4 shows a cross-sectional side view of an embodiment of a core section of FIG. 2.

FIG. 4 shows a cross-sectional side view of a memory cell in core section 401. In one embodiment, core section 401 is an embodiment of core section 201 of FIG. 2.

Memory cell 440 includes a portion of substrate 405, dielectric spacer layer 443, channel region 444, source/drain regions 442a and 442b, and layered stack 445, including charge trapping component 446 and a portion of core polysilicon line 441. Substrate 405 may be an embodiment of substrate 205 of FIG. 2. Source/drain regions 442a and 442b may be an embodiment of one or more conductive regions 242 of FIG. 2. Core polysilicon line 441 may be an embodiment of an individual core polysilicon line 241 of FIG. 2.

In operation, core polysilicon line 441 and source/drain regions 442a and 442b are configured to provide electrical potential(s) to memory cell 440 for trapping charge at charge trapping component 446. A bit is "programmed" when it is trapping a charge and "unprogrammed" when it is not trapping charge. To trap charge, charge trapping component 446 employs tunneling layer 447, charge trapping layer 448, and dielectric layer 449. In general, tunneling layer 447 provides a tunneling barrier, charge trapping layer 448 is a layer that is configured to store charge, and dielectric layer 449 electrically isolates charge trapping layer 448 from core polysilicon line 441. In one embodiment, memory cell 440 is a one bit memory cell that is configured to store up to two logic states. In another embodiment, memory cell 440 can store more than two logic (or bit) states.

In some embodiments, charge trapping component 446 is an oxide-nitride-oxide (ONO) layer in which dielectric layer 449 is an oxide (such as silicon dioxide), charge trapping layer 448 is a nitride, and tunneling layer 447 is an oxide (such as silicon dioxide). In one embodiment in which charge trapping layer 448 is a nitride, charge trapping layer 448 may be a silicon-rich nitride (SiRN) or a stoichiometric silicon nitride. Dielectric spacer layer 443 may be a nitride spacer, an oxide-nitride spacer, other type of spacer composed of one or more dielectric materials, or the like.

Modern semiconductor devices are typically created as integrated circuits manufactured on the surface of a substrate of semiconductor material, which is typically a wafer formed by slicing a single crystal ingot grown by a Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that transmits light through a photomask, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design, which may be stored in a machine-readable medium. Various design tools may be used by the designer in creating the design, simulating the design, and checking the design for layout rules violations. When completed, the design files are provided to the fabricator, which are used to generate photomasks for use in the fabricating the device. The design files may be communicated in different ways, including over a network.

Figure 5:
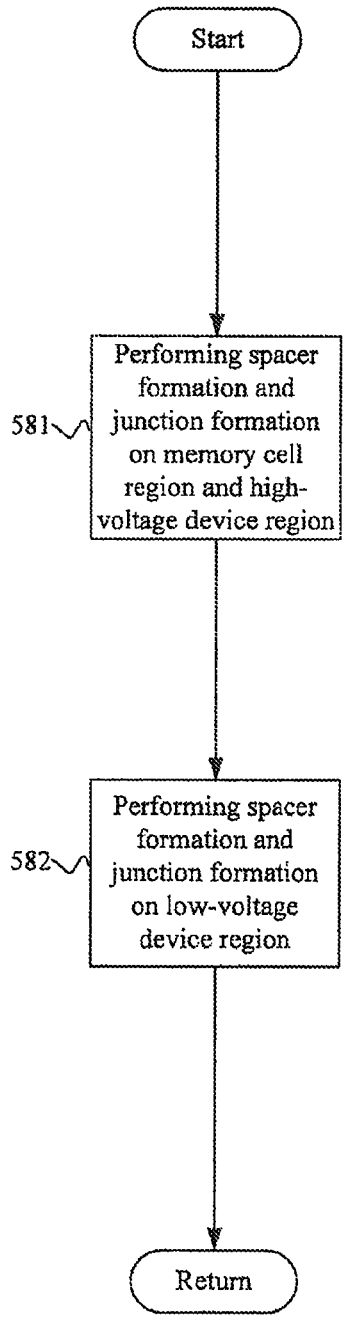
FIG. 5 illustrates a flow chart of an embodiment of a process.

FIG. 5 illustrates a flow chart of an embodiment of a process (580). After a start block, the process proceeds to block 581, where spacer formation and junction formation are performed on both: a memory cell region in a core section of a memory device in fabrication, and a high-voltage device region in a periphery section of the memory device in fabrication. The spacer formation and junction formation on both the memory cell region and the high-voltage device region includes performing a rapid thermal anneal.

The process then moves to block 582, where spacer formation and junction formation on a low-voltage device region in the periphery section is performed. The process then proceeds to a return block, where other processing is resumed.

In this way, two different types of spacers are formed—with one kind of spacer that may be optimized for the core and high-voltage devices, and another kind of spacer that may be optimized for the low-voltage devices, without the formation of one type of spacer adversely affecting the opposite type of devices during its formation. In some embodiments, as discussed in greater detail below, the spacers are composed of oxide and nitride.

Figure 6:
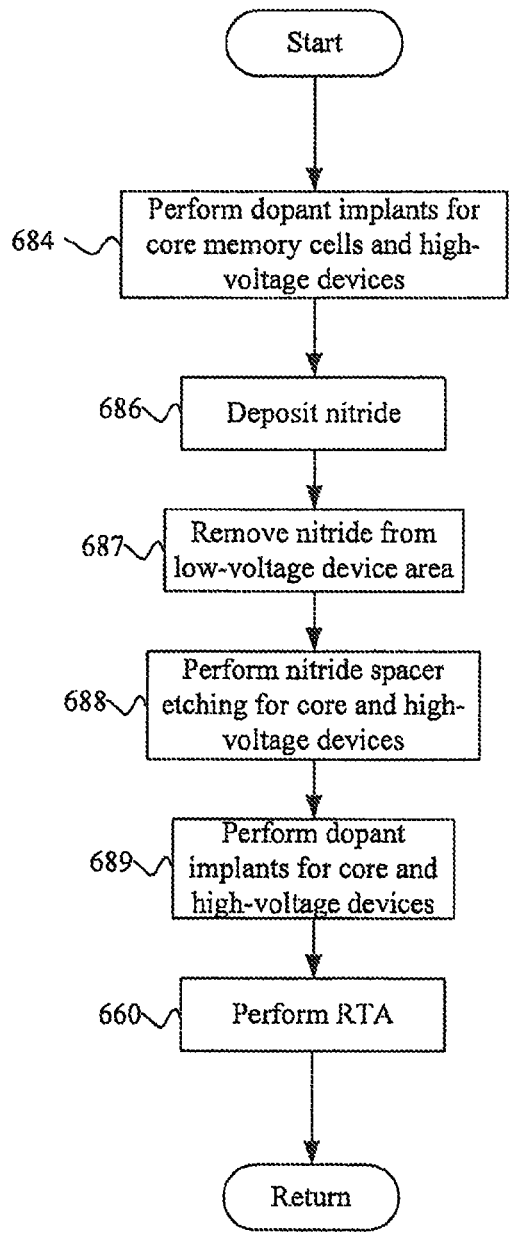
FIG. 6 shows a flow chart of an embodiment of a process for the step of spacer formation and junction formation on the memory cell region and high-voltage device region of FIG. 5.

FIG. 6 shows a flow chart of an embodiment of a process for step 581 of FIG. 5. After a start block, the process proceeds to block 684, where one or more dopant implants are performed on both: the memory cell region and the high-voltage device region of the memory device in fabrication. For example, in some embodiments, lightly-doped drain (LDD) implants are performed.

The process then moves to block 686, where a nitride deposition is performed on the wafer, including the core section and the periphery section. In some embodiments, a liner deposition is performed on the entire wafer just prior to the nitride deposition. In some embodiments, the deposited liner is an oxide liner. In other embodiments, the liner may be composed of a material other than oxide, such as a carbide, or the like. In yet other embodiments, the liner is not included. The process then advances to block 687, where the nitride (and subsequently the oxide liner, in embodiments that include an oxide liner) is removed from the low-voltage device region. The process then proceeds to block 688, where nitride spacer etching is performed in the memory cell region and the high-voltage device region while the low-voltage device region is protected by a photoresist mask. The process then moves to block 689, where one or more additional dopant implants are performed on the memory cell region and the high-voltage device region. For example, in some embodiments, source/drain implants are performed. The process then advances to block 660, where a rapid thermal anneal (RTA) is performed. The process then proceeds to a return block, where other processing is resumed.

Figure 7:
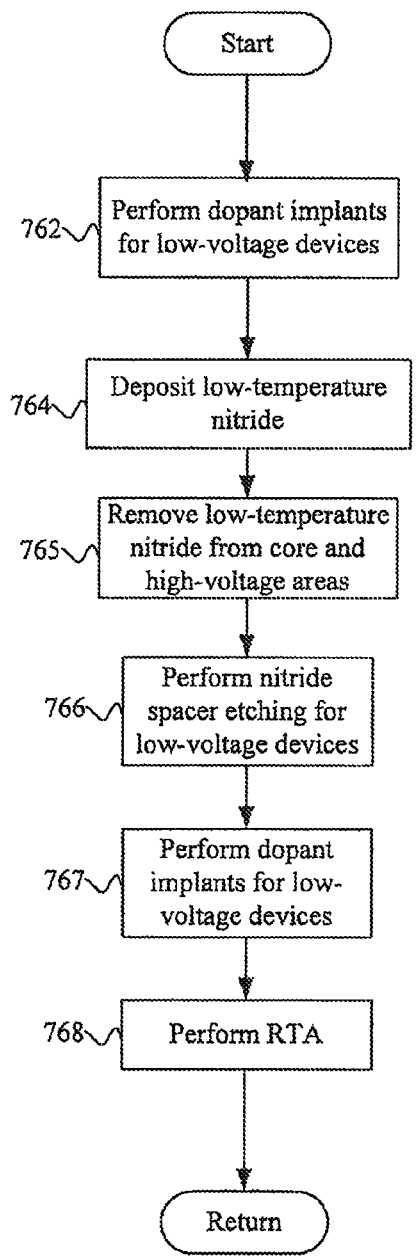
FIG. 7 illustrates a flow chart of an embodiment of a process for the step of spacer formation and junction formation on the low-voltage device region of FIG. 5.

FIG. 7 illustrates a flow chart of an embodiment of a process for an embodiment of step 582 of FIG. 5. After a start block, the process proceeds to block 762, where one or more dopant implants are performed on the low-voltage device region of the periphery section of the memory device in fabrication. For example, in some embodiments, lightly-doped drain (LDD) implants are performed.

The process then moves to block 764, where a low temperature nitride deposition is performed on the wafer, including the core section and the periphery section. In some embodiments, a low temperature oxide liner deposition is performed on the entire wafer just prior to the nitride deposition. In other embodiments, liner other than an oxide liner may be deposited, and in yet other embodiments, no liner deposition is performed. The process then advances to block 765, where the low temperature nitride is removed from the core section and the high-voltage device section. In embodiments that include a low temperature oxide liner deposition, this leaves the oxide liner only in these regions. The process then proceeds to block 766, where nitride spacer etching is performed in the low-voltage device region. The process then moves to block 767, where one or more additional dopant implants are performed on the low-voltage device region. For example, in some embodiments, source/drain implants are performed. The process then advances to block 768, where a rapid thermal anneal (RTA) is performed. The process then proceeds to a return block, where other processing is resumed.

Figure 8:
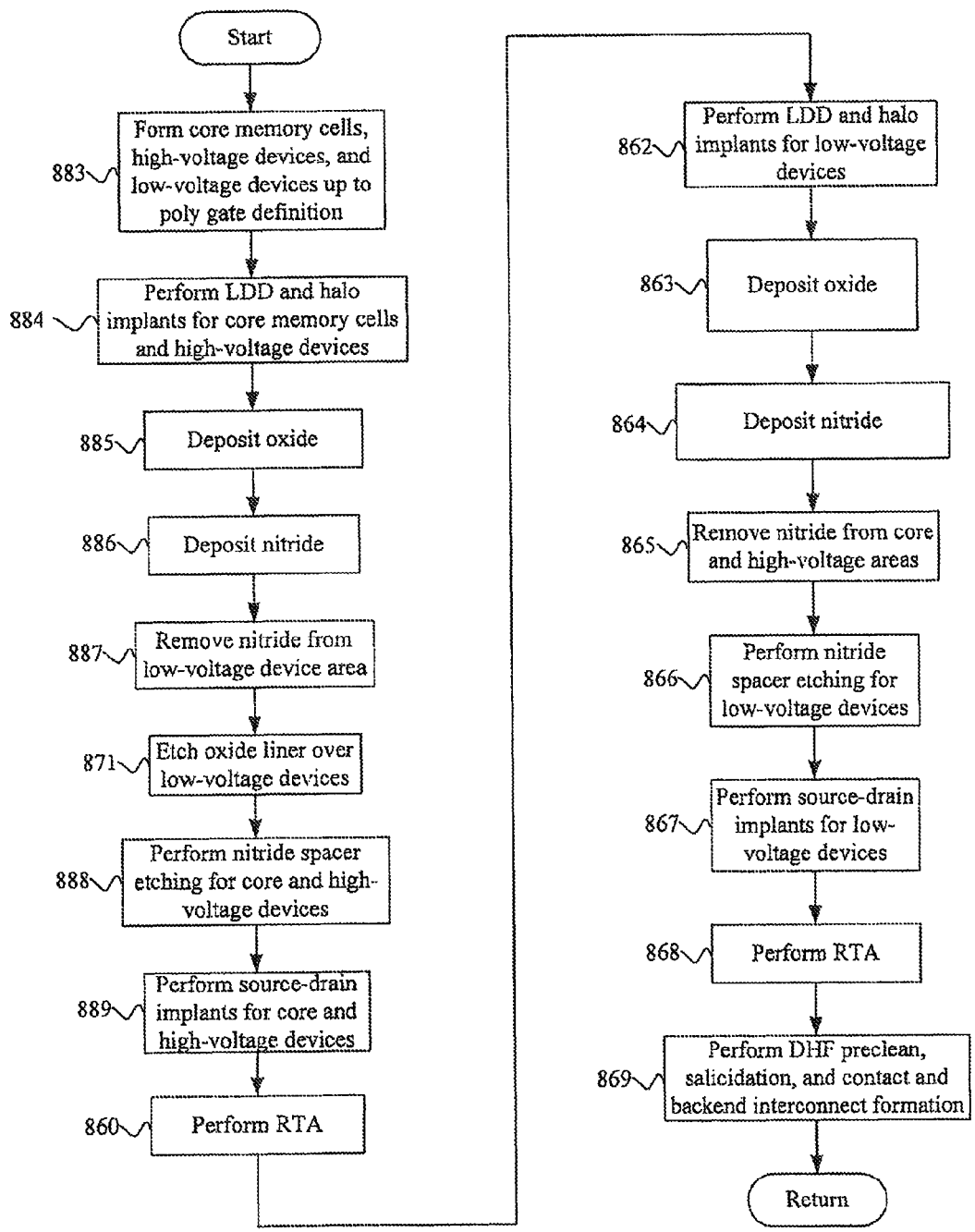
FIG. 8 shows a flow chart of an embodiment of the process of FIG. 5.
Figure 9:
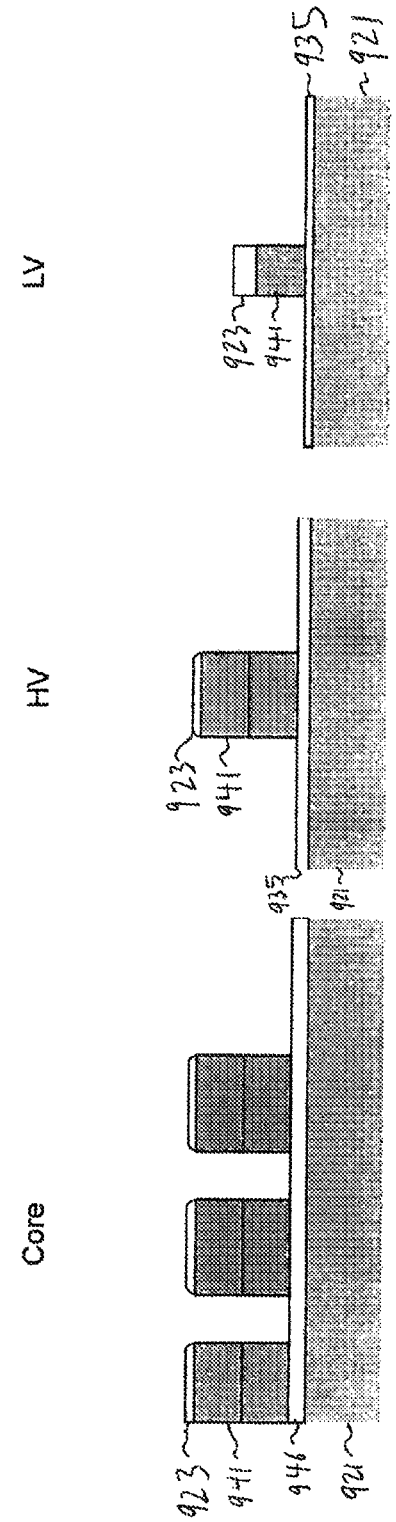
FIGS. 9-14 illustrate embodiments of portions of a flash memory device in fabrication, including the core region, high-voltage device region, and low-voltage device region, as various steps in the process of FIG. 8 are performed.

FIG. 8 shows a flow chart of an embodiment of process 880, which may be employed as an embodiment of process 580 of FIG. 5. FIGS. 9-14 illustrate embodiments of portions of a flash memory device in fabrication, including the core region, high-voltage device region, and low-voltage device region, as various steps in process 880 of FIG. 8 are performed. FIGS. 9-14 illustrate a particular embodiment of a flash memory device which should not be construed as limiting, since they only illustrate one particular embodiment by way of example. Similarly, FIG. 8 illustrates one particular embodiment of a process which should not be construed as limiting, since it illustrates one particular embodiment by way of example. After a start block, the process proceeds to block 883, where core cell devices (i.e., core memory cells), high voltage devices (e.g., for sector select and decoders) and low voltage devices (e.g., for high performance logic), are formed up to polysilicon (poly) gate definition, as illustrated in FIG. 9 in one embodiment.

FIG. 9 illustrates substrate 921, poly gate 941, hardmask oxide 923, charge trapping component 946, and gate dielectric 935 in an embodiment of portions 900 of the flash memory device in fabrication after poly etching. As discussed in greater detail above, in some embodiments, charge trapping component 946 may be an ONO layer or the like. Gate dielectric 935 may be a gate oxide or the like. The portions 900 include the core region (Core), high-voltage device region (HV) and low-voltage device region (LV). In some embodiments, the core devices and/or the high voltage devices may use thicker poly gates than the low voltage devices in the fast logic circuits in order to prevent dopant implant penetration. As a consequence, the thickness of the hardmask oxide remaining on poly after poly etch may differ depending on the time the hardmask oxide has been exposed to poly etching. In some embodiments, the core region and/or the high-voltage device region may include transistors in fabrication having an oxide hardmask with a thickness of about 250 Å after poly etch, whereas the low-voltage device region may include low-voltage transistors in fabrication having an oxide hardmask with a greater thickness than the core and/or high-voltage transistors due to a shorter poly etch. However, some embodiments do not include oxide hardmasks.

The process then moves to block 884, where LDD and halo implants needed for high voltage devices as well as other implants needed for the core cell transistors up to this point are performed. LDD and halo implants for low voltage devices are not performed at this time. In embodiments in which the device is an n-type transistor, the LDD implant is an n implant, and the halo implant is a p implant. The halo implant is tilted at an angle and implanted around the gate to form a "halo" around the gate. The LDD implant is lightly doped (as opposed to the later source/drain implant, which is heavily doped, and the LDD implant is typically lighter and shallower than the source/drain implant) for minimizing short-channel effects.

The process then advances to block 885, where a high-temperature, high-quality oxide liner is deposited. In some embodiments, the deposition is accomplished by low-pressure chemical vapor deposition (LPCVD). In some embodiments, the oxide is silicon dioxide about 100-200 Å thick, and the deposition is a high-temperature oxidation (HTO) performed at about 650-800° C. The process then proceeds to block 886, where nitride spacer material is deposited on the entire wafer. In some embodiments, the nitride spacer material is silicon nitride, and the deposition is accomplished by low-pressure chemical vapor deposition (LPCVD) from tetrachlorosilane (TCS). In some embodiments, this silicon nitride deposition is about 600-1000 Å, and performed at about 650-800° C.

Figure 10:
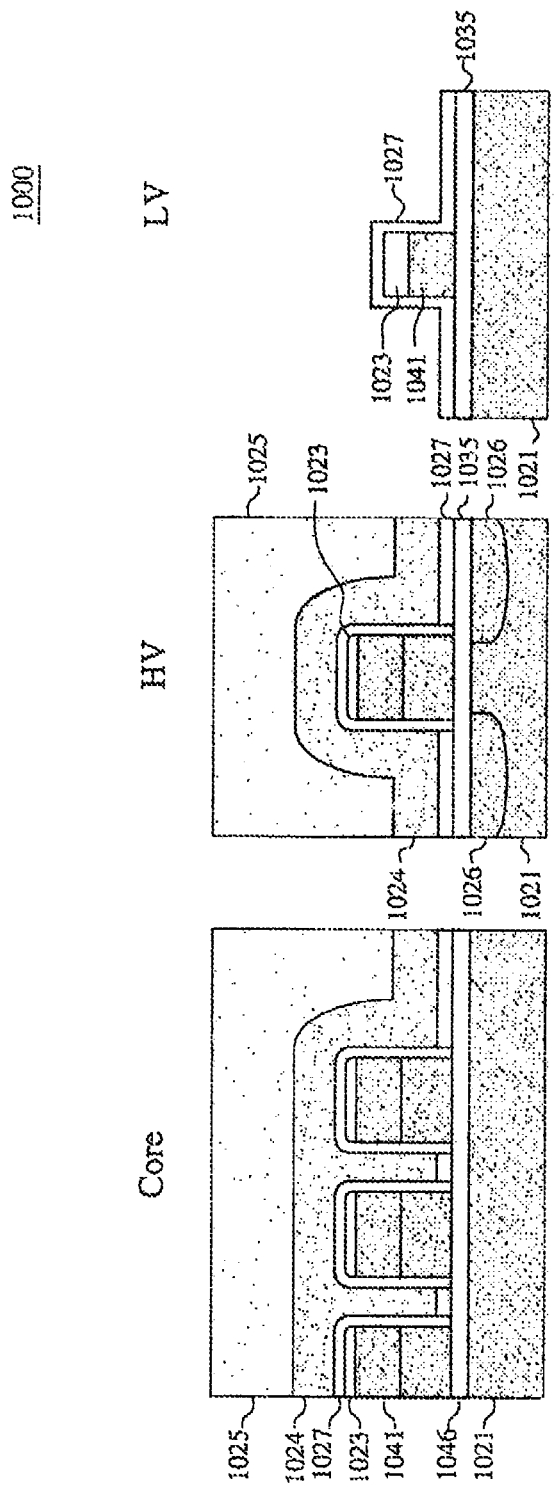

The process then moves to block 887, where the high temperature spacer nitride is removed from the low voltage device areas by using an isotropic, highly selective nitride chemical dry etch process in conjunction with a photoresist mask. This will leave the original high temperature oxide liner over the low voltage devices. The portions of flash memory device 1000 in fabrication after the step in block 887 are illustrated FIG. 10. FIG. 10 further illustrates nitride 1024, photoresist 1025, high-temperature oxide liner 1027, and LDD implant 1026.

The process then advances to block 871, where the high-temperature oxide liner remaining over the low-voltage devices is etched by using a conventional anisotropic oxide etch which is selective to substrate 1121 (which typically comprises of silicon), while the photoresist mask protecting the core and high-voltage devices in block 887 is still in place. This results in a thin oxide spacer around the poly gates of the low-voltage devices. In some embodiments, the etch duration is extended beyond the time needed to remove the high-temperature oxide liner so that most or all of the hardmask oxide on the low-voltage poly gates are also removed. The photoresist mask prevents the oxide etch from affecting the core and high-voltage transistors.

The process then advances to block 888, where high-quality nitride spacers for the core and high voltage devices are formed by using a conventional anisotropic nitride etch which is selective to oxide while protecting the low voltage device areas using another photoresist mask. The nitride spacers formed protect, for example, the LDD regions during, for example, a source-drain implant to occur subsequently (block 889), and therefore may be referred to as "LDD spacers". The use of nitride as the spacer material minimizes the erosion during subsequent cleans using dilute hydrofluoric acid. The photoresist mask used for this etch is removed after the nitride spacers are formed.

Figure 11:
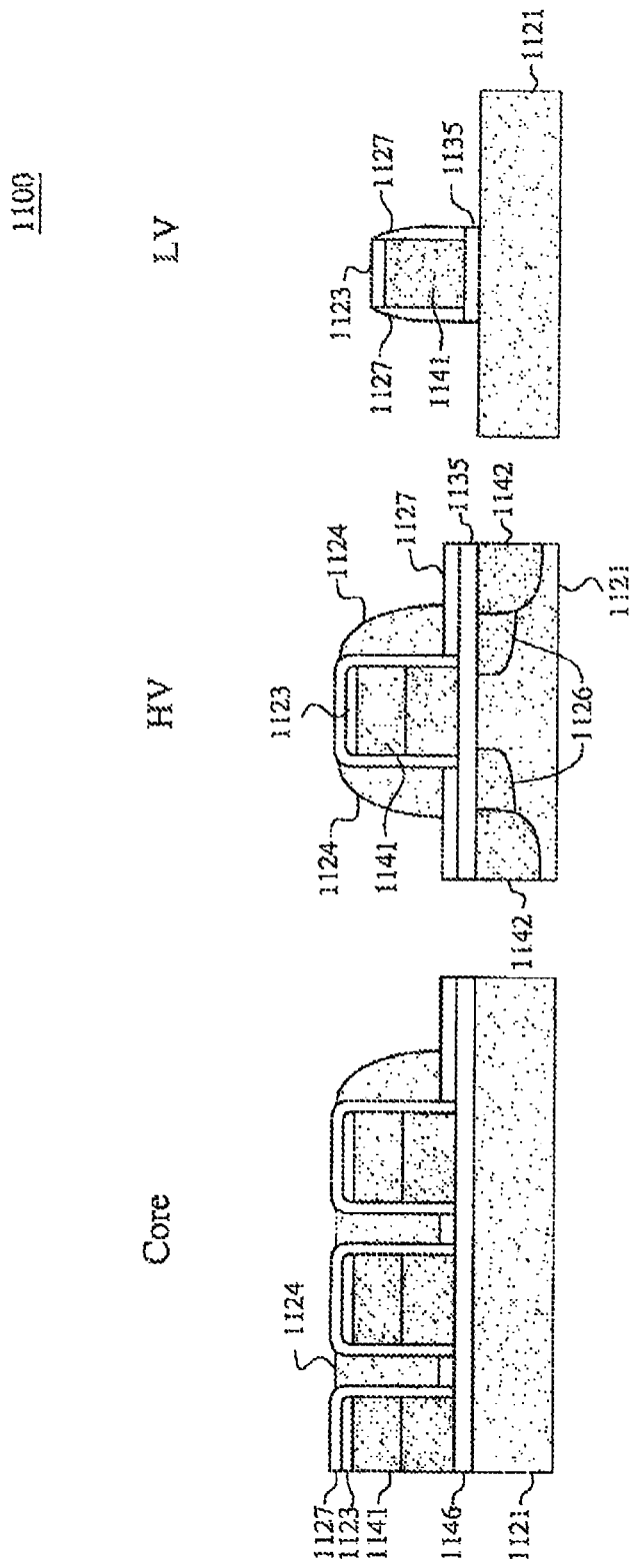
Figure 12:
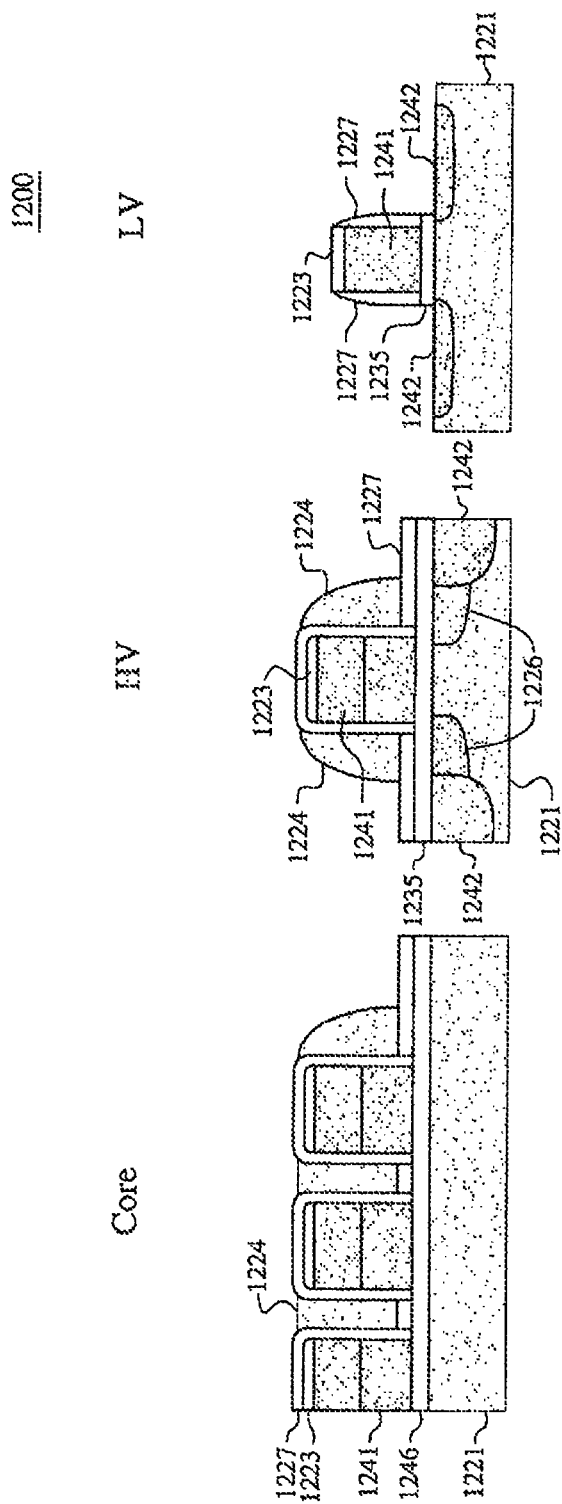
Figure 13:
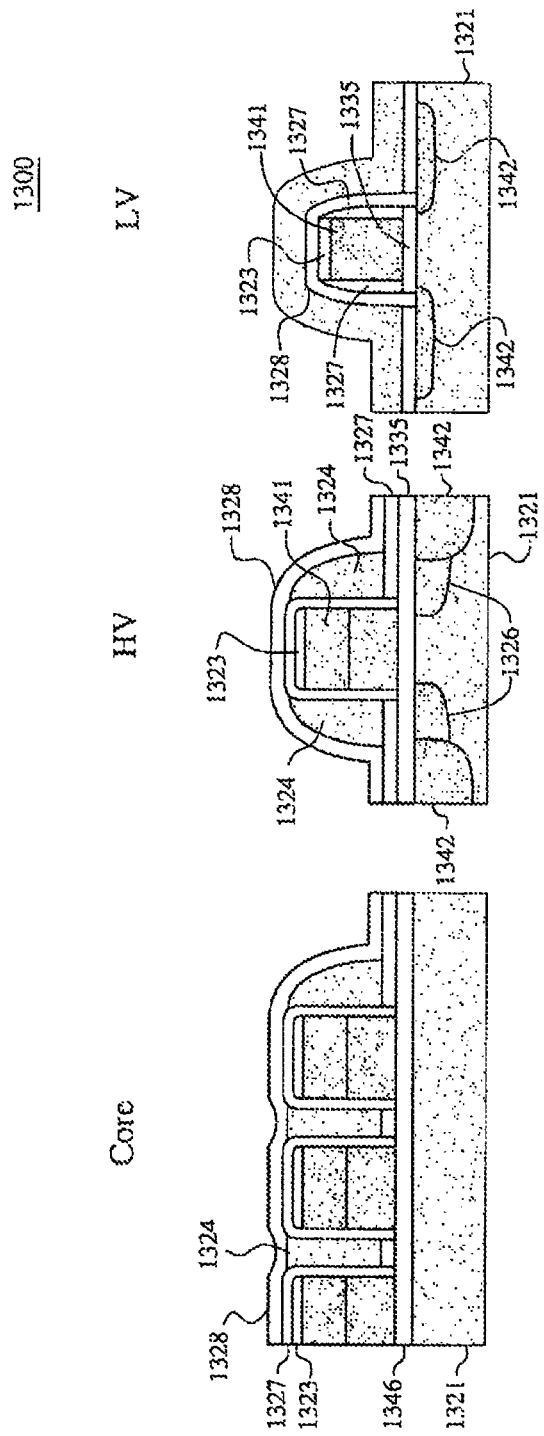
Figure 14:
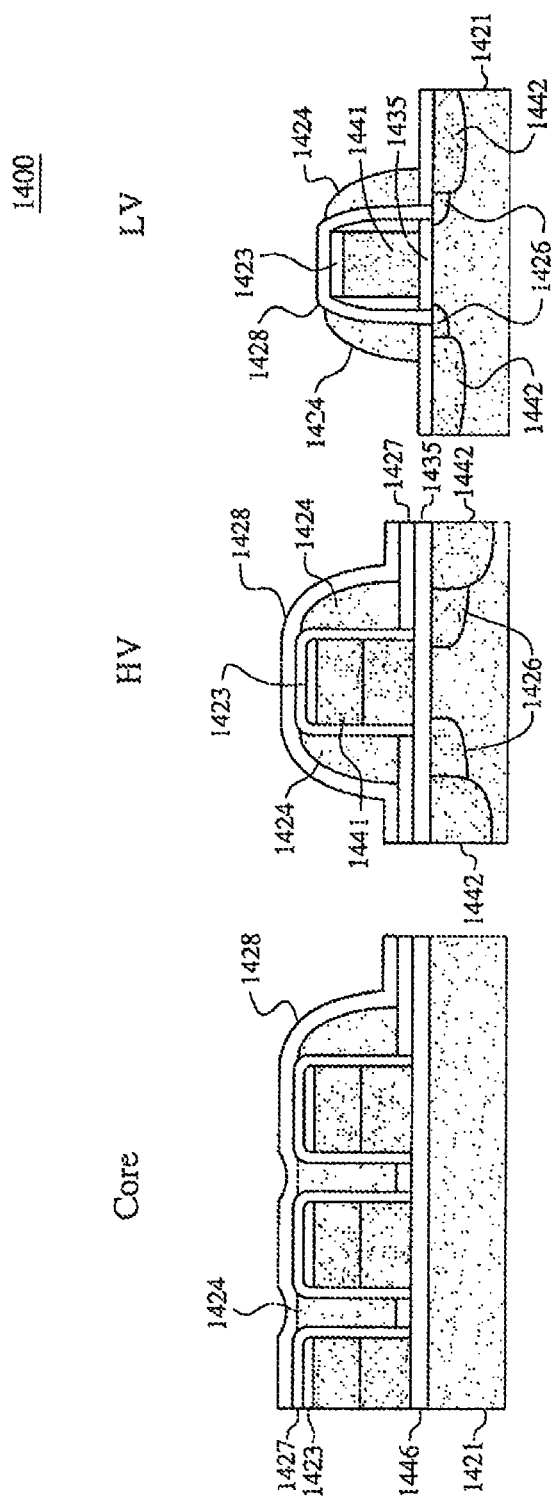

The process then proceeds to block 889, where source-drain implants are performed for the high voltage devices, as well all remaining implants needed for the core cell devices, using additional photoresist masks. In some embodiments, the implants performed at block 889 also include a bit line isolation (BII) implant in core using a photoresist mask. However, the BII implant is an optional implant that is not performed in some embodiments of the invention. The process then moves to block 860, where RTA is performed to activate the implants for the core and HV devices. The RTA step diffuses the dopants deeper to maximize the junction breakdown characteristics. The RTA may be performed with a reduced thermal cycle in anticipation of the RTA that will be performed later at step 868. The RTA at block 860 does not affect the LV devices since there has been no dopant implant there yet. The portions of flash memory device 1100 in fabrication after the step in block 860 are illustrated FIG. 11. FIG. 11 further illustrates source-drain implants 1142.

The process then proceeds to block 862, where LDD and halo implants are performed for the low-voltage devices using photoresist masks. The core and high-voltage regions are protected by these photoresist mask during these implants. The portions of flash memory device 1200 in fabrication after the step in block 862 are illustrated FIG. 12.

The process then moves to block 863, where a low temperature oxide liner is deposited. In some embodiments, the oxide deposition is about 100-200 Å of silicon dioxide and is a low-temperature deposition performed at less than 500° C. The process then proceeds to block 864, where a low temperature nitride spacer material is deposited over the entire wafer. The nitride thickness for the low-voltage devices is significantly thinner than the nitride thickness for the high-voltage devices. In some embodiments, the nitride deposition is about 300-500 Å of silicon nitride and is a low-temperature deposition performed at less than 500° C. In some embodiments, such low temperature depositions of block 863 and block 864 can be achieved by conventional plasma-enhanced CVD (PECVD) or atomic layer deposition (ALD) processes and will not cause dopant diffusion.

The process then advances to block 865, where the low temperature spacer nitride material is removed from the core and high voltage device areas by using an isotropic, highly selective nitride etch process in conjunction with a resist mask. This leaves the low temperature oxide liner in the core and high voltage device areas. Using an isotropic etch at block 865 allows for a complete removal of the nitride from the core and high-voltage device regions. The resist mask is removed after the isotropic nitride etch. The portions of flash memory device 1300 in fabrication after the step in block 865 is illustrated FIG. 13. Flash memory device 1300 further includes low-temperature liner 1328.

The process then proceeds to block 866, where low temperature nitride spacers are formed for the low-voltage devices by using a conventional anisotropic nitride etch which is selective to the low temperature oxide liner. A photoresist mask may be used to protect the core and high-voltage device areas during this etch. If sufficient etch selectivity is achieved, the resist mask may not be necessary since the low temperature oxide liner will be protecting the core and high voltage device areas and the nitride etch is relatively short.

In other embodiments, block 865 is completely skipped and the etching of the low-temperature nitride is performed without a photoresist mask. This will form low-temperature nitride spacers for the low-voltage devices and small secondary nitride spacers for the core and high-voltage devices. This embodiment may be employed, for example, if the small secondary nitride spacers do not adversely affect the core and high-voltage devices.

The process then moves to block 867, where source-drain implants are performed for the low-voltage devices using photoresist masks. The photoresist masks protect the core and high-voltage device regions during the source-drain implants so that the implants occur only in the low voltage region.

The process then advances to block 868, where the implants for the low-voltage devices are activated by using spike RTA processing or millisecond anneals with flash lamps or lasers. The RTA performed at the step of block 868 is relatively short in duration. The thermal budget for this anneal should be designed not to significantly disturb the core or high-voltage devices. As previously discussed, the thermal budget in block 860 may take into account the fact that step 868 will be subsequently performed, so that the steps at block 860 and 868 together provides the total activation of the dopant implants for the core section and the high-voltage devices, where the step at block 868 provides the activation for the low-voltage devices. The portions of flash memory device 1400 in fabrication after the step in block 868 is illustrated FIG. 14.

The process then moves to block 869, where Dilute Hydrofluoric Acid (DHF) preclean, salicidation, contact and backend interconnect formation may be performed. The DHF preclean is a wet etch which removes the oxide layers on the silicon surfaces, as well as on the poly surfaces. As a result, the low-temperature oxide liner remaining in the core and high-voltage areas will be removed and not result in charge retention concerns. In some embodiments, the DHF preclean is accomplished in two parts. First, a longer DHF clean (approximately 100-200 Å oxide removal in some embodiments) is accomplished for the core and high-voltage regions to remove most of the oxide from poly and silicon surfaces, with the low-voltage region protected by a photoresist mask. Next, a shorter DHF clean (50-100 Å oxide removal in one embodiment) is performed for the entire wafer to remove the oxide in the low-voltage region as well any remaining oxide in the core and high-voltage region. The relatively short second DHF clean avoids excessive etching of the low-temperature nitride spacers in the low-voltage region.

The process then advances to a return block, where other processing is resumed.

Figure 15:
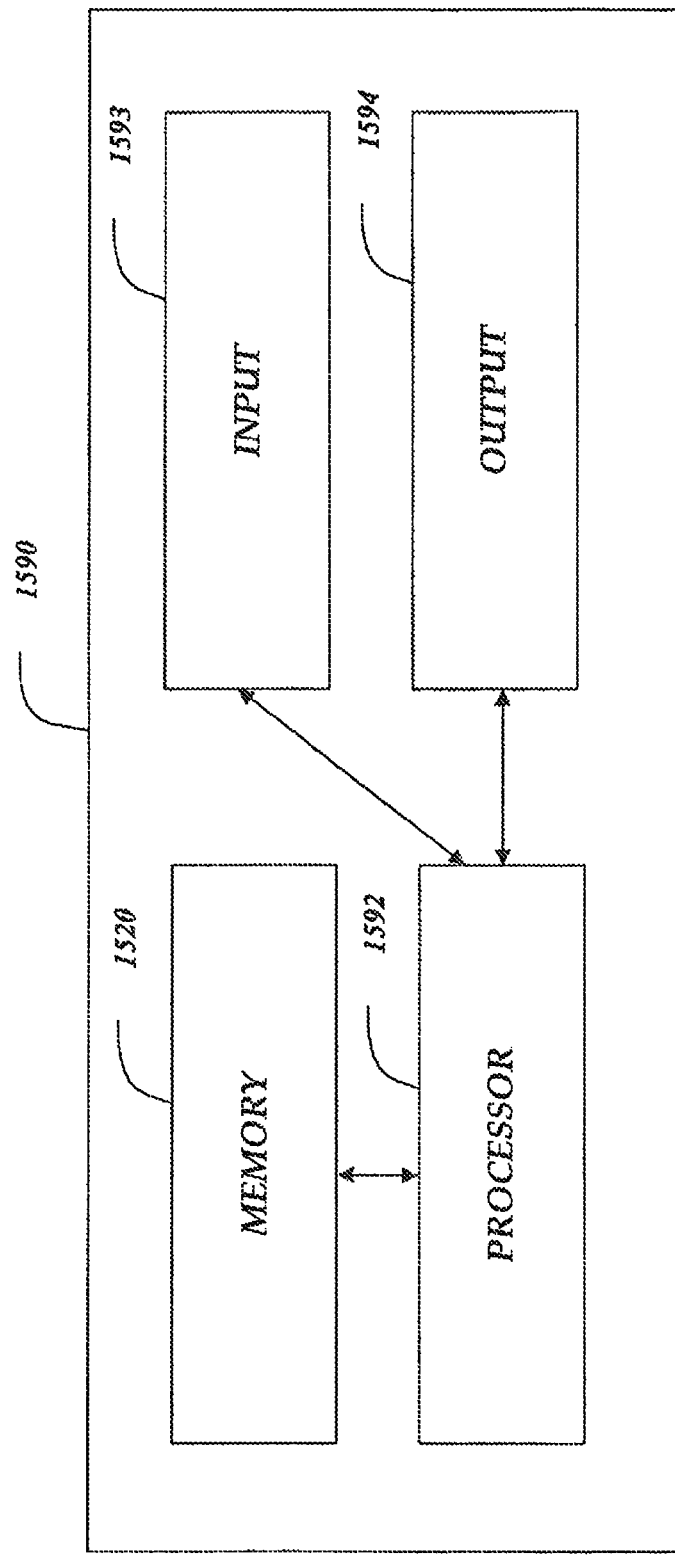
FIG. 15 illustrates a block diagram of an embodiment of a system that includes the memory device of FIG. 1, in accordance with aspects of the invention.

Embodiments of the memory device can be incorporated into any of a variety of components and/or systems, including for example, a processor and other components or systems of such components. FIG. 15 shows one embodiment of system 1590, which may incorporate memory 1520, which is an embodiment of memory device 100 of FIG. 1. Memory 1520 can be directly or indirectly connected to any one of processor 1592, input devices 1593, and/or output devices 1594. In one embodiment, memory 1520 may be configured such that it is removable from system 1590. In another embodiment, memory 1520 may be permanently connected to the components or a portion of the components of system 1590.

In many embodiments, memory 1520, processor 1592, input devices 1593, and/or output devices 1594 of system 1590 are configured in combination to function as part of a larger system. For example, system 1590 may be incorporated into a cell phone, a handheld device, a laptop computer, a personal computer, and/or a server device. In addition or alternatively, system 1590 can perform any of a variety of processing, controller, and/or data storage functions, such as those associated with sensing, imaging, computing, or other functions. Accordingly, system 1590 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A method for fabricating a memory device, including:
  performing spacer formation and junction formation on both: a memory cell region in a core section of a memory device in fabrication, and a high-voltage device region in a periphery section of the memory device in fabrication, wherein the spacer formation and junction formation on both the memory cell region and the high-voltage device region includes performing a first rapid thermal anneal;

after performing the spacer formation and junction formation on both the memory cell region and the high-voltage device region, performing spacer formation and junction formation on a low-voltage device region in the periphery section, wherein the spacer formation and junction formation on the low-voltage device region includes performing a second rapid thermal anneal having a duration shorter than that of the first rapid thermal anneal.

2. The method of claim 1, wherein the memory cell region, the high-voltage device region, and the low-voltage device region each include a plurality of transistors in fabrication, each of the plurality of transistors in fabrication includes a substrate and a gate, the spacer formation includes the formation of two spacers for each of the transistors in the memory device in fabrication, including a first spacer attached to said one side of the gate and a second spacer attached to another side of the gate.

3. A tangible machine-readable storage medium including an electronic design file that is arranged to control the performance of the method of claim 1.

4. A method, comprising transmitting, over a network, an article of manufacture including a machine-readable medium that includes an electronic design file that is arranged to control the performance of the method of claim 1.

5. The method of claim 1, wherein
performing spacer formation and junction formation on the low-voltage device region includes:
performing a dopant implant on the low-voltage device region;
performing a nitride deposition on the memory device in fabrication;
performing nitride spacer etching; and
performing another dopant implant on the low-voltage device region.

6. The method of claim 5, further comprising depositing a liner after performing the dopant implant on the low-voltage device region and before performing the nitride deposition.

7. The method of claim 6, wherein the liner is an oxide liner, and wherein depositing the liner is performed at a temperature less than about 550 degrees Celsius.

8. The method of claim 6, wherein the nitride deposition is performed at a temperature of less than about 550 degrees Celsius.

9. The method of claim 6, wherein the dopant implant on the low-voltage device region includes a lightly-doped drain implant.

10. The method of claim 6, wherein said another dopant implant on the low-voltage device region includes a source/drain implant.

11. The method of claim 1, wherein
performing spacer formation and junction formation on both the memory cell region and the high-voltage device region includes:
performing a dopant implant on both the memory cell and the high-voltage device region;
performing a nitride deposition on the memory device in fabrication;
removing nitride from the low-voltage device region;
performing nitride spacer etching in the memory cell region and the high-voltage device region;
performing another dopant implant on the memory cell region and the high-voltage device region, wherein the act of performing a first rapid thermal anneal is performed after performing said another dopant implant.

12. The method of claim 11, wherein the dopant implant includes a lightly-doped drain implant.

13. The method of claim 11, wherein said another dopant implant includes a source/drain implant.

14. The method of claim 11, wherein the nitride deposition on the entire memory device in fabrication is performed at a temperature of at least 650 degrees Celsius.

15. The method of claim 11, further comprising:
performing depositing an oxide liner after performing the dopant implant on the memory cell region and the high-voltage device region, and before performing the nitride deposition; and
removing the oxide liner from the low voltage device region after removing the nitride from the low-voltage device region.

16. The method of claim 15, wherein the oxide liner deposition is performed at a temperature of at least 650 degrees Celsius.

17. The method of claim 15, wherein
performing spacer formation and junction formation on the low-voltage device region includes:
performing a dopant implant on the low-voltage device region;
performing another nitride deposition on the memory device in fabrication;
removing the nitride from the memory cell region and the high-voltage device region;
performing nitride spacer etching on the low-voltage device region; and
performing another dopant implant on the low-voltage device region.

18. The method of claim 17, further comprising depositing a liner after performing the dopant implant on the low-voltage device region, and before performing said another nitride deposition.

19. The method of claim 18, wherein the liner is an oxide liner, and wherein said another oxide liner deposition is performed at a temperature of less than about 550 degrees Celsius.

20. The method of claim 18, wherein said another nitride deposition is performed at a temperature of less than about 550 degrees Celsius.

* * * * *